United States Patent [19]

Fulton

[11] Patent Number: 4,569,414

[45] Date of Patent: Feb. 11, 1986

[54] AUGMENTED SPEAKER ENCLOSURE

[76] Inventor: Robert W. Fulton, 4428 Zane Ave. North, Minneapolis, Minn. 55422

[21] Appl. No.: 518,468

[22] Filed: Jul. 29, 1983

[51] Int. Cl.⁴ .......... H05K 5/00

[52] U.S. Cl. .......... 181/156; 181/144; 181/151

[58] Field of Search .......... 181/156, 151, 147, 146, 181/144, 199, 152, 145

[56] References Cited

U.S. PATENT DOCUMENTS

| | | | |
|---|---|---|---|
| 3,412,824 | 11/1968 | Armstrong | 181/151 |
| 3,867,996 | 2/1975 | Lou | 181/146 X |
| 4,139,075 | 2/1979 | Kobayashi et al. | 181/156 X |
| 4,167,985 | 9/1979 | Dunlavy | 181/151 |

FOREIGN PATENT DOCUMENTS

| | | | |
|---|---|---|---|
| 104797 | 9/1938 | Australia | 181/156 |
| 612663 | 11/1948 | United Kingdom | 181/156 |

*Primary Examiner*—L. T. Hix
*Assistant Examiner*—Brian W. Brown
*Attorney, Agent, or Firm*—Orrin M. Haugen; Thomas J. Nikolai

[57] ABSTRACT

A high mass speaker enclosure having a speaker mounted to a front escutcheon plate and below which a multi-gated balanced acoustical transmission yoke is mounted and whereby a portion of the enclosure's interior air pressure is relieved so as to augment the speaker sound, especially at frequencies below 60 hertz. Enclosure resonance is minimized via the use of a high mass enclosure and the filing thereof with a fiberglass material around the speaker and a Dacron filler around the transmission yoke, while front mounted polyester mats preload the speaker and transmission yoke. Speaker resonance, lost sounds and/or extraneous speaker induced sounds are thereby avoided.

17 Claims, 9 Drawing Figures

AUGMENTED SPEAKER ENCLOSURE

BACKGROUND OF THE INVENTION

The present invention relates to balanced speaker systems and, in particular, to a speaker enclosure having an exterior wall with an elliptically-shaped opening formed therethrough, with the edges of the opening being tapered to cause air pressure waves to exit therefrom in a cone-shaped pattern, and acoustically balanced transmission yolk mounted thereto for relieving interior pressure and augmenting the bass range of the speaker without distortion or dampening at frequencies of 60 hertz and lower.

The integrity and quality of sound transfer systems is especially linked to speaker performance, since no matter how faithful a sound is recorded or replayed, distortion induced at the speaker still ruins the sound. While most recording systems do record and replay sounds rather faithfully for the mid-range frequencies, their performance tends to fall off at the upper and lower ends of the audio frequency range. Thus, it becomes especially important that any speaker system associated with any sound transfer system be responsive to this frequency roll off, without inducing any undesired distortion or extra sounds of its own or adding significantly to system losses.

Relative to woofer speakers, this becomes even more important, since the bass notes, through their low frequencies and high power output, due to their large surface speaker cones, tend to dominate over other frequencies and thus any speaker induced distortion tends to become rather pronounced relative to the listener. Also, because of the inherent driver losses at these low frequencies, the reproduced frequencies and sounds are not as full or complete as they should be. It is, therefore, desirable that for any system having a variety of speakers accomodating various frequency ranges that the bass speakers or woofers be able to augment the power losses of the driver without adding sounds of their own, creating interference, sympathetically resonating or otherwise distorting the sound.

Heretofore, a variety of speaker systems; including tubes, horns, labyrinths, transmission lines, screens, sub-woofers, etc., have been developed for faithfully reproducing recorded sounds and which most popularly have included the "infinite baffle" system wherein a completely sealed speaker enclosure contains the speaker that accommodates induced interior pressures without adding great distortion to the sound. Such speakers, however, suffer from a rather fast roll off at low frequencies and do not induce the high energy content sounds such as are required for frequencies of 60 hertz or less.

Theatre speakers, on the other hand, through various structural modifications, couple a portion of the back-pressure-wave induced by the speaker to a horn, a labyrinth or another passive radiator or speaker cone, the output of which augments the driven speaker. A problem attendant with such speakers, however, is high distortion and storage time which makes such speakers unsuitable for systems requiring high fidelity. Such speakers are efficient, however, and therefore may be used for public address systems or the like.

Additionally, the bass speaker of the present invention differs from known ported speakers in that in lieu of a circular or square port and a sound collecting tube, it employs an elliptical window which creates an air cone as pressure waves driven by the woofer exit therefrom. Also, an ellipsoidal or wedge-shaped cavity is positioned relative to the elliptical window and possesses a balanced acoustical transmission yoke. Internal speaker enclosure pressure waves are thus collected at the shaped gates opening to the transmission yoke, are formed and then transmitted through the elliptical window with less storage time to reinforce the reproduced sound at the frequencies of operation for which the driver equipment output begins to fall off. Furthermore, the window size and position are selected such that at the selected frequencies of operation, the elliptical window is operative to augment the generated sound in a real time fashion and in time-phase with the speaker's generated sound, thereby avoiding lost sounds or out-of-phase sounds inherent in the tube connected ported speakers. The window is also large enough so that a meaningful output is obtained thereby.

The speaker of the present invention is thus intended for combination in a system of speakers, where the present enclosure is typically used in conjunction with the woofer, while a mid-range speaker and tweeter are successively stacked thereabove. Appropriate bandpass filters separate the speakers and ensure operation at the proper crossover frequencies. For the woofer, a passive crossover with the oval window occurs at 60 hertz while the crossover with the mid-range driver occurs at approximately 130 hertz and while the tweeters crossover at 2,700 hertz. Each speaker, in turn, is separated from the other and the floor via a mat having a linear sound transfer function such as the Fulton Kinetic Barrier TM sound transfer mats sold by Fulton Musical Industries of Minneapolis, Minn.

The speakers of the preferred embodiment are also fabricated with a high mass, sound augmenting enclosure. In particular, the enclosures are comprised of a front escutcheon having a speaker opening bored therethrough and an underlying shaped ovaloid window mounted along the same axis as the woofer opening. An ellipsoidal or wedge shaped chamber, formed in a balanced acoustical transmission yoke, is mounted behind the elliptical window interior to the otherwise airtight speaker enclosure and is operative in a push-push fashion at frequencies below 60 hertz so as to augment the produced sound and thereby extend the range of frequency response for the speaker, without inducing additional distortion.

System operation is, in turn, enhanced due to the augmented bass response, lower crossover frequency and real time response characteristics of the present woofer. Complex sounds, such as are produced by symphonic orchestras, can now better be distinguished, since the bass sounds do not override the upper bass and midrange tweeter. The system's dynamic range is also wider and each instrument is better distinguishable from one another without "smearing", while bass power remains intact so as to permit the playback of the sounds at the same power levels as originally played.

The above objects, advantages and distinctions of the present speaker enclosure and system as well as various others will, however, become more apparent upon reference to the following description of the preferred embodiment thereof with respect to the following drawings. Before referring thereto, though, it is to be recognized that the following description is made with respect to the presently preferred embodiment only and thus various modifications (over and above those mentioned) may be made without departing from the spirit and scope of the present invention.

SUMMARY OF THE INVENTION

The present invention comprises a high mass speaker enclosure having a front escutcheon containing a speaker opening and a formed elliptical window opening which acts to create an air cone cooperating with an interiorly mounted multi-gated, balanced acoustical transmission yoke. The transmission yoke is centrally mounted relative to the speaker opening and contains a hollowed ellipsoidal cavity having two balanced gates opening thereto from the air space interior to the speaker enclosure. At the predetermined speaker frequencies of 60 hertz and below, induced air pressure changes interior to the otherwise airtight speaker enclosure produce real time responsive augmenting speaker sounds via the elliptical window.

The speaker and enclosure back are also sealed so as to seal the enclosure in an airtight fashion, except for the gates of the yoke while the speaker is surrounded by a dense fibrous material and while the transmission yoke is surrounded by a less dense material. The front of the escutcheon openings are, in turn, covered by correspondingly dense sound permeable and less dense materials such that the speaker is preloaded with a sound deadening or distortion reducing material while at the same time the elliptical window is preloaded with a less dense material.

In an alternative embodiment, the hollow chamber of the transmission yoke is comprised of a wedge-shaped region. It is further contemplated that in a system configuration, the present enclosure would incorporate a woofer speaker and additional midrange and tweeter speakers would be stacked and insulated from one another as well as the floor via linear sound transfer mats. Still further, the yoke chamber may be covered or roughened so as to preclude sympathetic resonance.

DESCRIPTION OF THE PREFERRED EMBODIMENT

Figure 1:
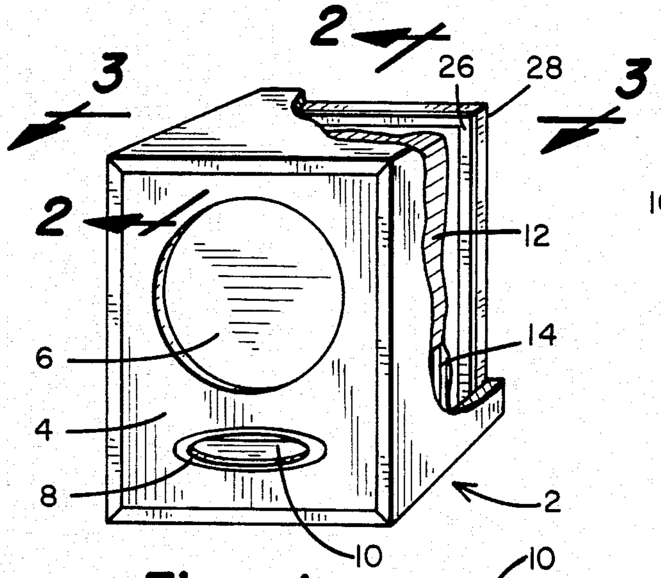
FIG. 1 shows a partially cutaway perspective view of the present speaker enclosure.

Referring to FIG. 1, a partially cutaway perspective view is shown of the present speaker enclosure 2. It is preferably fabricated from a three-quarter inch, laminated high density particle board. The enclosure is fabricated with mitred corners and for an eight inch diameter woofer, the outside demensions of the enclosure are approximately 11½ inches wide by 16 inches high by nine inches deep. It is to be recognized, though, that larger or smaller enclosures may also be fabricated in the present fashion. Mounted to the front of the enclosure is an escutcheon panel having an eight inch speaker hole 6 bored therein, near the top of the enclosure 2. An elliptical window 8 is centered and formed below it in the remaining open space of the panel 4. The elliptical window 8 has its edges chamfer routed inwardly so as to essentially form an air cone for the sound pressure waves which eminates therefrom.

The panel 4, like the enclosure 2, may be fabricated from a three-quarter inch high density particle board which tends to minimize undesired resonance of the enclosure itself for the typically encountered frequencies of the woofer speaker that is placed therein. Because the elliptical window 8 is centrally mounted, it produces a balanced sound relative to the interior gates 32 and 34 that are disposed to the right and left sides thereof. For the presently preferred embodiment and assuming the dimensions already set out above, the elliptical window 8 may measure approximately 2¼ inches high by 5¼ inches wide. For an 8-inch woofer, such a construction has been found to produce sounds of sufficient amplitudes at the audio frequencies for which the enclosure 2 augments the sound output of the speaker.

From FIG. 1, it is also to be noted that the interior of the enclosure 2 contains a fiber filler of two different materials. In particular, a fiberglass batt or filling 12 surrounds the speaker, while a less dense and more sound porous Dacron batt or filling 14 surrounds the elliptical window 8 and the balanced transmission yoke 10 mounted therebehind. Similarly, individual front panels 16 and 18 of greater and less density materials are mounted respectively in front of the speaker opening 6 and the ovaloid window 8. The fiber material 12 and 14 within the enclosure thus dampens and minimizes any resonance of the enclosure 2 that might otherwise occur, while the front panels 16 and 18 serve to preload the outputs and again dampen any resonance or distortion that might otherwise be generated.

Figure 2:
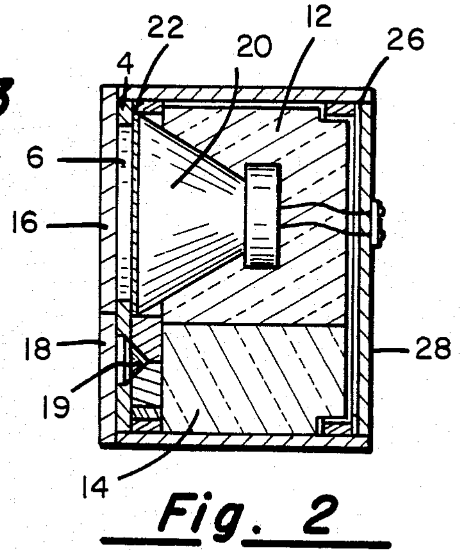
FIG. 2 shows a cross-sectional view taken along lines 2—2 of FIG. 1.
Figure 3:
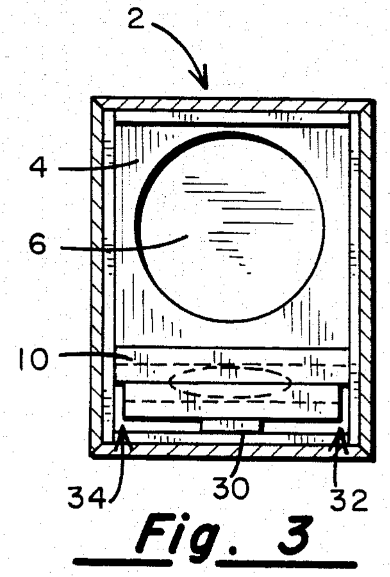
FIG. 3 shows a cross-sectional view taken along lines 3—3 of FIG. 1.

Drawing attention next to FIG. 2, a cross-section view of FIG. 1 taken along lines 2—2 is shown. It more particularly depicts the various components of the present enclosure 2 and their relative disposition with respect to each other. FIG. 2 shows a more detailed view of the balanced acoustical transmission yoke 10 that is juxtaposed behind the elliptical window 8. The yoke 10, which will be discussed in greater detail with respect to FIGS. 3 and 4, generally is fabricated in a "T-like" structure that extends across the width of the escutcheon panel 4 so as to contact both side walls of the enclosure 2. The centrally located wedge-like chamber 19 is open to the enclosure 2 on at least two sides and one of which sides for a wedge-like chamber 19 can be seen. The woofer speaker 20, in turn, mounts to the escutcheon panel 4 via a plurality of screws (not shown) and an annular seal 22 is mounted between the speaker and the escutcheon to create an airtight seal. Surrounding the speaker 20 is the fiberglass batt 12, while the more porous Dacron bat 14 surrounds the transmission yoke 10. The enclosure is completed via an airtight seal 26 that is established between the enclosure side walls and the back panel 28 which is screwed thereto. The back panel 28 also contains the necessary terminal strips (not shown) for making appropriate electrical interconnections with the various other speakers of the system and for the present embodiment also includes appropriate cross over circuitry to ensure the proper frequency separation between the speaker 20 and the associated other speakers (not shown).

As mentioned, principal to the improved operation of the present speaker is the inclusion of the acoustical transmission yoke 10 in combination with the elliptical window 8 in the escutcheon panel 4. A more detailed view relative to the mounting thereof can be seen upon reference to FIG. 3 which is a cross-sectional view taken along lines 3—3 of FIG. 1. From FIG. 3, the back of the yoke 10 can more clearly be seen relative to its mounting across the panel 4. As mentioned, the yoke is comprised of a "T-like" member and the two longer horizontal arms of which contact the sides of the enclosure 2 while the lower, fatter vertical portion is suspended above the bottom of the cabinet via a spacer block 30. Shown in dotted line are the edges of the wedged-like cavity 19 (FIG. 4*b*) which have been empirically shown to provide a similar sound quality to that of an ellipsoidal chamber 19. (FIG. 4*c*) Also, due to the present configuration, the opposed ends of the chamber 19 open to the inside of the enclosure in the regions 32 and 34. This results in the frequency of the reproduced sound being reduced. Also, as the pressure within the enclosure 2 increases, a progressively generated sound is produced at greater and greater amplitudes and eminates from the chamber 19 and elliptical window 8 so as to augment the sound from the speaker 20. For frequencies above 60 hertz, such eminations are nominal, but at approximately 60 hertz, the eminations become more and more significant and correspondingly add to the overall sound eminating from the speaker, thereby augmenting the speaker sound, especially in the range of frequencies where the sound replay or driving equipment frequency response is falling off. In particular, for most sound replay equipment, the frequency response thereof falls approximately seven to ten decibels over the frequency range from 20 to 60 hertz, but which in the preferred embodiment decreases only about three to four decibels. In the prior art tuned ported speakers, 12 to 18 percent distortion is commonly encountered at these frequencies, but for the preferred embodiment is only about 0.06 percent.

This augmentation of the sound better defines and makes the bass sounds between 20 to 60 to 60 and 130 hertz more discernable to the listener. Individual bass notes and the instruments generating them are thereby better discernible, rather than sounding as a smeared composite.

Figure 4B:
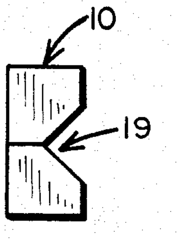
FIG. 4*b* shows an end view of the acoustical transmission yoke of FIG. 4*a*.
Figure 4A:
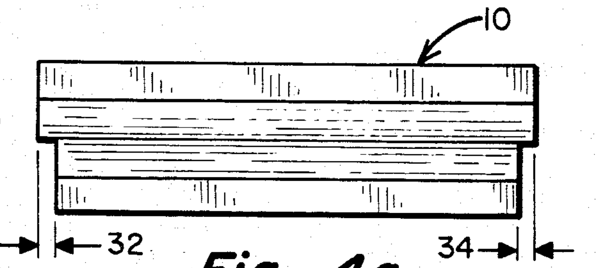
FIG. 4*a* shows a detailed elevation view of the present wedge-like balanced acoustical transmission yoke.
Figure 4C:
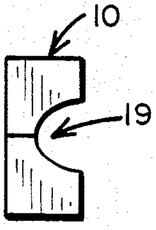
FIG. 4*c* shows an end view of an alternative, elliptical balanced transmission yoke.

Attention is next directed to FIGS. 4*a*, 4*b* and 4*c* wherein further details of the present transmission yoke 10 can be seen. In particular, upon referring to FIG. 4, a front elevation view is shown of the present transmission yoke 10. Its end view is shown in FIG. 4*b*, and an alternative yoke employing an ellipsoidal chamber 19 is shown in FIG. 4*c*. The yoke 10 may be fabricated from a piece of pine 2×4, although for larger speaker designs, a 4×4 would be employed. The cavity 19 for the 2×4 yoke 10 is approximately two inches high and three-quarters of an inch deep. By adjusting the chamber size, though, various levels of augmentation can be achieved. Also, by varying the vertical placement of the yoke 10 relative to the speaker, the amplitude of the augmenting sound can also be varied. While the ovaloid window is shown in the drawings as being centered below the speaker opening 6 in the escutcheon panel 4, alternatively, it could be formed in the bottom wall of the enclosure 2, the back 28, or on each of the sides, but in any of these cases, the yokes 10 should be symetrically mounted relative to the sound internal to the enclosure so as to augment the speaker sound without distortion. For a bottom mounting, an open pedestal should be employed to ensure that the sound is not muffled. In such an arrangement, the floor becomes a medium by which the sound is further eminated to the room, just as where a back mounted opening utilizes the wall to help distribute the sound.

Depending upon the size of the speaker 20 and enclosure 2, it should also be noted that it is desirable to roughen the interior surface of the chamber 19 or line it with the Fulton Kinetic Barrier TM material so as to prevent against the sympathetic resonance of the yoke 10. Irrespective of whether a wedge-shaped cavity (FIG. 4*b*) or ellipsoidal cavity (FIG. 4*c*) is used, the sound storage time of the chambers 19 is negligible at the audio frequencies so that a real time frequency response is obtained which does not distort the speaker sound as it is added thereto.

Figure 5:
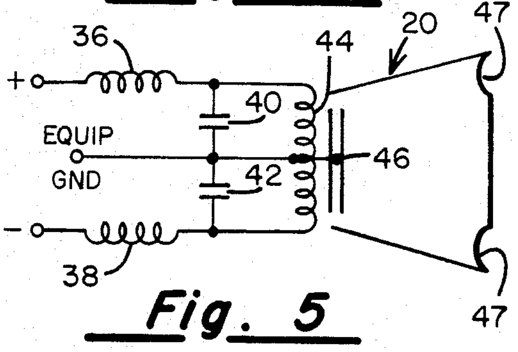
FIG. 5 shows a schematic diagram of the balanced speaker driver circuitry.

Directing attention now to FIG. 5, an electrical schematic is shown of the present speaker 20. It comprises a balanced arrangement of the signal lines to the speaker 20. Specifically, chokes or inductors 36 and 38 are placed in series in the plus and minus input lines, while a balanced, center tapped capactive network is coupled in parallel to the voice coil 44 and the permanent magnet 46 (typically 70 oz.) with the center tap between the capacitors 40 and 42 also being coupled to the equipment ground. Thus, not only is the yoke 10 balanced in the regions 32 and 34 relative to the sound pressure within the enclosure 2, but also the speaker 20 will be driven in a balanced fashion so as to thereby further relieve distortion. The present speaker 20 is specially formed with annilus-like reliefs 47 formed in the speaker cone so as to allow deep excursions without bumping the front grill material and under extreme bass passages reflect tighter control of the moving speaker cone mass itself.

Figure 6:
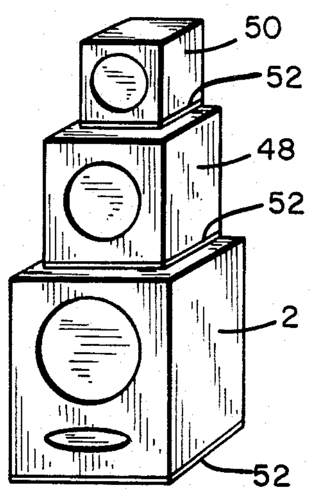
FIG. 6 shows a typical system diagram of a plurality of speakers for a single output channel.

Directing attention to FIG. 6, a system representation is also shown for a speaker system including the enclosure 2 of the present invention. Specifically, it is contemplated that for such a system the various speakers thereof would be stack mounted above the woofer enclosure 2 and as shown in FIG. 6 include a midrange enclosure 48 and a tweeter enclosure 50. Each of the speakers would, in turn, be separated from one another and from the floor by the aforementioned Fulton Kinetic Barrier TM sound transfer mats 52.

Figure 7:
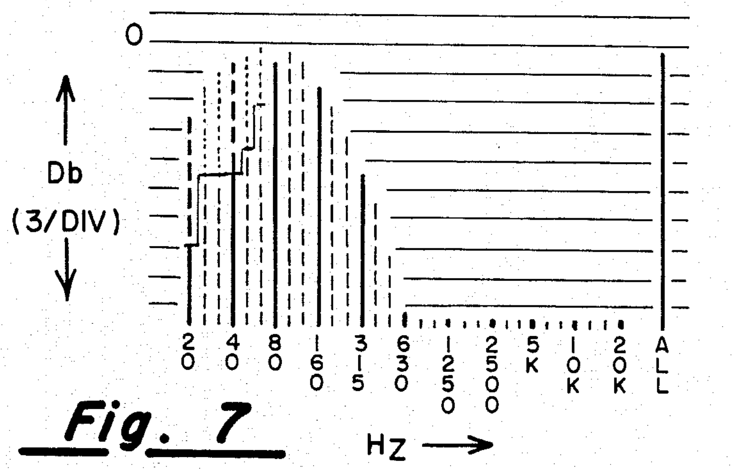
FIG. 7 shows the combined frequency response of a typical augmented woofer of the present type.

Finally, a representation of the composite frequency response for the present speaker 20 in enclosure 2 is shown in FIG. 7. From this figure, the aforementioned additive effect of the output from the elliptical window 8 can be seen relative to the independent response of the speaker 20 alone. In particular, it is to be noted that elliptical without the window 8, the speaker response is down approximately 24 decibels at 20 herz; but that the net response is down only seven decibels, when the sound output of the elliptical window 8 is added. Up to 60 hertz, the speaker's response is thus augmented, thereby improving the quality of the total sound over the range of frequencies for which the output of the driving equipment falls off.

While the present invention has been described with respect to its presently preferred embodiment, it should be apparent from the above that various modifications may be made thereto without departing from the spirit and scope thereof. It is, therefore, contemplated that the following claims should be interpreted so as to include all those equivalent embodiments within the spirit and scope of the described invention.

What is claimed is:

1. An enclosure for an audio speaker comprising in combination:

a hollow cabinet fabricated from a high mass material having two side walls, a top, a bottom, a front and a back wall which together define an interior first cavity and wherein one of said walls contains means for receiving audio signals and another of said walls has a first opening formed therethrough to the exterior of said enclosure and opposite of which first opening a speaker is mounted internal to said enclosure;

a second opening formed through said another of said walls of said enclosure; and sound augmenting means including an elongated member extending between said two side walls within said first cavity, said elongated member having a second cavity mounted opposite to said second opening, said first cavity otherwise surrounding said sound augmenting means, said elongated member including a plurality of air passages proximate the opposed end edges of said elongated member communicating with said second cavity interiorly of said enclosure for receiving sound at said air passages and retransmitting sounds below a predetermined frequency via said second opening, thereby passively progressively augmenting the sound transmitted from said speaker.

2. An enclosure as set forth in claim 1 wherein said second opening is elliptical.

3. An enclosure as set forth in claim 2 wherein said second opening is made through said front wall with the edges defining said opening being tapered inwardly from a front surface of said front wall to a back surface of said front wall to cause spreading of the pressure waves emanating from said second opening in a cone-like pattern.

4. An enclosure as set forth in claim 1 wherein said elongated member of said sound augmenting means comprises a T-shaped member attached to the interior surface of said front wall and wherein opposed ends of the cross portion of said T-shaped member define an air passage with the stem portion of said T-shaped member, said air passage opening to said second cavity, whereby sound vibrations below said predetermined frequency are received and conducted via said air passages to said second cavity and exit said interior first cavity via said second opening.

5. An enclosure as set forth in claim 1 wherein the surface of said elongated member defining said second cavity are roughened to preclude sympathetic resonance.

6. Apparatus for passively progressively augmenting the frequency response of an audio speaker comprising:

a box-like speaker enclosure having a speaker mounted therein and an opening formed through a wall thereof; and an elongated cavity containing member having opposed ends and mounted inside said speaker enclosure with said cavity disposed opposite said opening and including air passages proximate said opposed ends extending between said cavity and the interior of said speaker enclosure for passively augmenting the sounds reproduced by said speaker at frequencies below a predetermined frequency.

7. Apparatus as set forth in claim 6 wherein said edges in said wall defining opening taper inwardly from the exterior surface of said enclosure so as to cause spreading of the pressure waves emanating from said opening in a cone-like pattern.

8. Apparatus as set forth in claim 6 wherein said speaker has a center tapped voice coil, the center tap being coupled to an equipment ground and wherein each of the opposed ends of said voice coil of said speaker are coupled to one end of respective first and second chokes and to the opposite ends of which chokes are coupled respective first and second audio inputs and first and second capacitors electrically coupled between said center tap and the opposed ends of said voice coil.

9. An audio speaker comprising:

a box-like enclosure having a plurality of mutually perpendicular walls defining a first cavity, one of said walls having a first opening therethrough;

a speaker mounted inside said first cavity to one of said walls adjacent to said first opening;

a sound permeable filler material disposed interiorly of said enclosure about said speaker and filling a part of said first cavity;

a second opening formed in a wall of said enclosure, the edges defining said opening having inwardly tapering edges from an exterior surface to an interior surface of said wall;

sound augmenting means having a second cavity mounted within said first cavity, said second cavity being mounted adjacent to said second opening, said sound augmenting means including one or more air passages extending from said first cavity through said sound augmenting means to said second cavity for passively receiving sounds interiorly of said enclosure and for retransmitting sounds below a predetermined frequency from said second opening so as to passively progressively augment the sound transmitted from said speaker.

10. A speaker as set forth in claim 9 wherein said sound permeable filler material comprises a first sound permeable filler material and a second sound permeable filler material, said second sound permeable filler material being less dense as compared to said first sound permeable filler material and mounted adjacent to said means having a second cavity.

11. A speaker as set forth in claim 9 including a sound permeable mat mounted exteriorly of and over said first opening for preloading said speaker.

12. A speaker as set forth in claim 11 wherein said second opening is formed in the same wall as said first opening, wherein the density of said sound permeable mat varies between a first and a second region thereof, said first region being more dense than said second region, and wherein said first region is mounted in overlying relation to said first opening and speaker and said second region is mounted in overlying relation to said second opening.

13. An audio speaker system comprising:

a plurality of speakers, each speaker reproducing a predetermined range of audio frequencies and each speaker being mounted in a separate, box-like enclosure having mutually perpendicular side walls, with each enclosure positioned adjacent to at least one other enclosure;

a material having a linear sound transfer characteristic mounted between adjacent ones of said enclosures; and wherein at least one of said box-like enclosures contains an opening in an exterior wall surface thereof and an elongated sound augmenting member, said member having opposed ends abutting opposed ones of said mutually perpendicular side walls and a cavity of a predetermined shape formed therein, said member having a plurality of air passages disposed proximate said opposed ends and connecting said cavity of a predetermined shape to the interior of said one of said enclosures, said cavity of a predetermined shape being aligned with said opening in said exterior wall surface so that sounds received at said air passages below a predetermined frequency are transmitted via said cavity of a predetermined shape and said opening to passively augment the sound transmitted from said speaker mounted in said one of said enclosures.

14. An enclosure for an audio speaker comprising in combination:

a hollow cabinet fabricated from a high mass material having two side walls, a top, a bottom, a front and a back wall which together define an interior first cavity, one of said side, front or back walls supports means for receiving audio signals, said front wall having first and second openings formed therethrough to the exterior of said enclosure and opposite of which first opening a speaker is mounted internal of said enclosure; and a generally T-shaped member having a cross portion extending normal to a stem portion and mounted inside said first cavity, said cross portion and stem portion defining a second cavity disposed opposite said second opening, said T-shaped member affixed to said front wall and extending toward said two side walls to define at least one air passage communicating with said second cavity, whereby sounds below a predetermined frequency are received and conducted via said air passages to said second cavity and retransmitted via said second opening to augment the sound from said speaker.

15. An enclosure as set forth in claim 14 wherein said second cavity is ellipsoidal.

16. An enclosure as set forth in claim 14 wherein said second cavity is three dimensionally wedge-like.

17. An enclosure as set forth in claim 14 wherein the surfaces of said cross portion and stem portion defining said second cavity are roughened to preclude sympathetic resonance.

* * * * *